United States Patent
Kawasaki et al.

(10) Patent No.: US 10,370,771 B2
(45) Date of Patent: Aug. 6, 2019

(54) METHOD OF MANUFACTURING CU CORE BALL

(71) Applicant: Senju Metal Industry Co., Ltd., Tokyo (JP)

(72) Inventors: Hiroyoshi Kawasaki, Tochigi-ken (JP); Takahiro Roppongi, Tochigi-ken (JP); Daisuke Soma, Tochigi-ken (JP); Isamu Sato, Saitama-ken (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 195 days.

(21) Appl. No.: 15/461,866

(22) Filed: Mar. 17, 2017

(65) Prior Publication Data
US 2017/0233884 A1   Aug. 17, 2017

Related U.S. Application Data (62) Division of application No. 14/606,948, filed on Jan. 27, 2015, now abandoned.

(30) Foreign Application Priority Data

Jan. 28, 2014  (JP) ................. 2014-013528

(51) Int. Cl.
  *B23K 35/02* (2006.01)
  *C22C 9/00* (2006.01)
  (Continued)

(52) U.S. Cl.
  CPC ............. *C25D 3/60* (2013.01); *B22F 1/025* (2013.01); *B22F 9/08* (2013.01); *B23K 35/025* (2013.01);
  (Continued)

(58) Field of Classification Search
  None
  See application file for complete search history.

(56) References Cited

U.S. PATENT DOCUMENTS 5,935,406 A   8/1999   Hajmrle et al.
6,290,746 B1  9/2001   Yamamoto
(Continued)

FOREIGN PATENT DOCUMENTS

CA    2384002 A1 *  1/2002
CN    101213325 A    7/2008
(Continued)

OTHER PUBLICATIONS

Office Action/Notice of Refusal from Japanese priority application No. 2014-013528, 3 pgs.
(Continued)

*Primary Examiner* — George Wyszomierski
(74) *Attorney, Agent, or Firm* — Chernoff, Vilhauer, McClung & Stenzel, LLP (57) ABSTRACT

A Cu core ball and a method of manufacturing such a Cu core ball. Purity of the Cu internal ball is at least 99.9% and not greater than 99.995%. A total contained amount of Pb and/or Bi in impurity contained in the Cu ball is equal to or larger than 1 ppm. Its sphericity is at least 0.95. A solder plating film coated on the Cu ball is of Sn solder or a lead free solder alloy whose primary component is Sn. In the solder plating film, a contained amount of U is not more than 5 ppb and that of Th is not more than 5 ppb. A total alpha dose of the Cu ball and the solder plating film is not more than 0./0200 cph/cm2. An arithmetic average roughness of the Cu core ball is equal to or less than 0.3 μm.

11 Claims, 5 Drawing Sheets

TABLE 1

| | ALLOY COMPOSITION | | | | | | | | | | | | | | | ALPHA DOSE (cph/cm²) | SPHERICITY |
|---|---|---|---|---|---|---|---|---|---|---|---|---|---|---|---|---|---|
| | Cu | Sn | Sb | Bi | Zn | As | Ag | Cd | Ni | Pb | Au | P | S | U | Th | | |
| Cu BALL USING Cu PELLET HAVING PURE DEGREE OF 99.9% | bal. | 84 | 21 | 32 | 3 | 49 | 20 | 7 | 4 | 16 | 4 | 200 | 18 | 1.5 | (0.5) | <0.0010 | 0.9932 |
| Cu BALL USING Cu WIRE HAVING PURE DEGREE 99.995% | bal. | 8 | 10 | 19 | - | 24 | 13 | - | 1 | 8 | - | - | - | (0.5) | (0.5) | <0.0010 | 0.9931 |
| Cu BALL USING Cu PLATE HAVING PURE DEGREE > 99.995% | bal. | 13 | 2 | 18 | - | 10 | - | - | 1 | 3 | - | - | - | 0.9 | (0.5) | <0.0010 | 0.9227 |

*ppb FOR MASS OF U, Th; ppm FOR MASS OF OTHER ELEMENTS (51) Int. Cl.
  C25D 5/12      (2006.01)
  C25D 3/60      (2006.01)
  H01L 23/00     (2006.01)
  B23K 35/26     (2006.01)
  B23K 35/30     (2006.01)
  C22C 13/00     (2006.01)
  H01B 1/02      (2006.01)
  B22F 9/08      (2006.01)
  B22F 1/02      (2006.01)
  C25D 5/20      (2006.01)
  F16B 5/08      (2006.01)
  C25D 3/30      (2006.01)
  B23K 101/40    (2006.01)
  H05K 3/34      (2006.01)

(52) U.S. Cl.
  CPC ...... *B23K 35/0222* (2013.01); *B23K 35/0244* (2013.01); *B23K 35/26* (2013.01); *B23K 35/262* (2013.01); *B23K 35/30* (2013.01); *B23K 35/302* (2013.01); *C22C 9/00* (2013.01); *C22C 13/00* (2013.01); *C25D 3/30* (2013.01); *C25D 5/12* (2013.01); *C25D 5/20* (2013.01); *F16B 5/08* (2013.01); *H01B 1/02* (2013.01); *H01L 24/13* (2013.01); *B22F 2301/10* (2013.01); *B22F 2301/30* (2013.01); *B23K 2101/40* (2018.08); *H01L 2224/13014* (2013.01); *H01L 2224/13147* (2013.01); *H01L 2224/13582* (2013.01); *H01L 2224/13611* (2013.01); *H01L 2224/13655* (2013.01); *H01L 2224/13657* (2013.01); *H01L 2924/0105* (2013.01); *H01L 2924/0109* (2013.01); *H01L 2924/01082* (2013.01); *H01L 2924/01083* (2013.01); *H01L 2924/01092* (2013.01); *H01L 2924/12042* (2013.01); *H01L 2924/15321* (2013.01); *H05K 3/3436* (2013.01); *H05K 2201/0218* (2013.01); *H05K 2201/10734* (2013.01)

(56) References Cited

U.S. PATENT DOCUMENTS

| | | |
|---|---|---|
| 6,451,135 B1 | 9/2002 | Takahashi et al. |
| 6,518,667 B1 | 2/2003 | Ichida et al. |
| 6,669,122 B2 * | 12/2003 | Kaully ........... B01J 2/06 241/1 |
| 6,799,711 B2 | 10/2004 | Kurata et al. |
| 2003/0141342 A1 | 7/2003 | Kurata et al. |
| 2009/0098012 A1 | 4/2009 | Shindo et al. |
| 2010/0212456 A1 | 8/2010 | Asada |
| 2012/0138330 A1 * | 6/2012 | Masago ........... C25D 5/10 174/68.1 |
| 2012/0299182 A1 * | 11/2012 | Uno ........... H01L 24/48 257/738 |
| 2014/0010705 A1 * | 1/2014 | Kanou ........... C22C 9/00 420/491 |
| 2015/0122661 A1 * | 5/2015 | Woertink ........... C25D 7/123 205/253 |

FOREIGN PATENT DOCUMENTS

| | | |
|---|---|---|
| CN | 102376586 A | 3/2012 |
| CN | 103415633 A | 11/2013 |
| EP | 1357197 A1 | 10/2003 |
| EP | 2548981 A1 | 1/2013 |
| EP | 2684970 A1 | 1/2014 |
| JP | 2003-193283 | 7/2003 |
| JP | 2005-002428 | 1/2005 |
| JP | 2005-036301 | 2/2005 |
| JP | 2007075856 A | 3/2007 |
| JP | 4472752 B2 | 6/2010 |
| JP | 2010-216004 | 9/2010 |
| JP | 2011-206815 | 10/2011 |
| JP | 5408401 B1 | 2/2014 |
| JP | 5435182 B1 | 3/2014 |
| WO | 95/24113 A1 | 9/1995 |
| WO | 2007/004394 A1 | 1/2007 |
| WO | 2012/120982 A1 | 9/2012 |

OTHER PUBLICATIONS

English translation of Decision to Grant a Patent, dated Jul. 1, 2014 for Japanese priority Application No. 2014-013528, 6 pages.
English translation of Office Action from related pending Korean Application No. 10-2015-0012612, mailing date of Office Action: dated May 20, 2015, 6 pages.
Office Action from related pending Korean Application No. 10-2015-0012612, mailing date of Office Action dated Jul. 20, 2015, 5 pages.
European Patent Office, Extended European Search Report for European Patent Application No. 15 152 403.0, dated Aug. 17, 2015 (Aug. 17, 2015), 8 pages.
State Intellectual Property Office of P.R. China, Office Action dated Dec. 16, 2015, for Application No. 201510044092.8, 15 pages.

* cited by examiner

TABLE 1

| | Cu | Sn | Sb | Bi | Zn | As | Ag | Cd | Ni | Pb | Au | P | S | U | Th | ALPHA DOSE (cph/cm$^2$) | SPHERICITY |
|---|---|---|---|---|---|---|---|---|---|---|---|---|---|---|---|---|---|
| | | | | | ALLOY COMPOSITION | | | | | | | | | | | | |
| Cu BALL USING Cu PELLET HAVING PURE DEGREE OF 99.9% | bal. | 84 | 21 | 32 | 3 | 49 | 20 | 7 | 4 | 16 | 4 | 200 | 18 | 1.5 | (0.5) | <0.0010 | 0.9932 |
| Cu BALL USING Cu WIRE HAVING PURE DEGREE 99.995% | bal. | 8 | 10 | 19 | - | 24 | 13 | - | 1 | 8 | - | - | - | (0.5) | (0.5) | <0.0010 | 0.9931 |
| Cu BALL USING Cu PLATE HAVING PURE DEGREE > 99.995% | bal. | 13 | 2 | 18 | - | 10 | - | - | 1 | 3 | - | - | - | 0.9 | (0.5) | <0.0010 | 0.9227 |

*ppb FOR MASS OF U, Th; ppm FOR MASS OF OTHER ELEMENTS

FIG. 4

TABLE 2

| | SOLDER FILM COMPOSITION | | | | | | | | | | | | | | | Cu CORE BALL α DOSE (cph/cm$^2$) | Cu CORE BALL SPHERICITY |
|---|---|---|---|---|---|---|---|---|---|---|---|---|---|---|---|---|---|
| | Sn | Sb | Cu | Bi | Zn | Fe | Al | As | Ag | In | Cd | Ni | Pb | Au | U | Th | | |
| SAMPLE 1 | bal. | 0 | 0 | 0 | 0 | 0 | 0 | 0 | 1 | 0 | 0 | 4 | 3 | 1 | (0.2) | <0.2 | <0.0010 | 0.9925 |
| SAMPLE 2 | bal. | 3 | 2900 | 0 | 0 | 4 | 0 | 10 | 29500 | 2 | 0 | 15 | 12 | 0 | <0.2 | <0.2 | <0.0010 | 0.9938 |
| COMPARISON EXAMPLE | bal. | 12 | 0 | 18 | 0 | 5 | 0 | 23 | 7 | 11 | 0 | 30 | 46 | 1 | <0.2 | <0.2 | 0.183 | 0.9868 |
| Sn SHEET MATERIAL | bal. | 11 | 0 | 18 | 0 | 5 | 0 | 21 | 6 | 11 | 0 | 30 | 49 | 1 | <0.2 | (0.2 | α DOSE OF Sn SHEET MATERIAL 0.203 | — |

*ppb FOR MASS OF U, Th; ppm FOR MASS OF OTHER ELEMENTS

TABLE 3

| PROSSING TIME OF ULTRASONIC WAVE [min.] | Ra μm |
|---|---|
| 0 | 0.64 |
| 5 | 0.58 |
| 10 | 0.47 |
| 30 | 0.36 |
| 60 | 0.22 |
| 90 | 0.22 |

METHOD OF MANUFACTURING CU CORE BALL

CROSS REFERENCE TO RELATED APPLICATION

The present invention contains the subject matter related to Japanese Patent Application No. 2014-13528 filed in the Japanese Patent Office on Jan. 28, 2014, the entire contents of which being incorporated herein by reference.

BACKGROUND OF THE INVENTION

Field of the Invention:

The present invention relates to a Cu core ball, a solder paste and a solder joint having an improved surface roughness and low alpha dose.

Description of Related Art:

Recently, along development of compact information equipment, electronic components to be mounted on them have been downsized rapidly. A ball grid array (hereinafter referred to as "BGA") having electrodes at its rear surface is applied to such electronic components in order to satisfy a requirement of a narrowed connection terminal and a reduced mounting area because of the downsizing requirement.

In the electronic components wherein the BGA is applied to its semiconductor package, a semiconductor chip having electrodes is sealed with resin and solder bumps are formed on the electrodes of the semiconductor chip. The solder bump is that a solder ball is joined to the electrode of the semiconductor chip. This solder bump is connected to a conductive land of a printed circuit board so as to be mounted on the printed circuit board.

Recently, a three-dimensional high-density package is studied by stacking up the semiconductor packages in a height direction in order to meet the further high-density mounting.

In a case that the BGA is applied to the semiconductor package for the three-dimensional high-density mounting, the solder ball may be crushed by a semiconductor package's weight. If such an accident happens, the solder may be forced out so that a Short circuit may happen between the electrodes.

In order to resolve the above-described problems, it is considered to use a ball whose hardness is higher than that of the solder ball. As the ball having a higher hardness, a solder bump using a Cu ball or Cu core ball is reviewed. The Cu core ball is that a coating (solder plating film) is formed on a surface of the Cu ball.

Since the Cu ball and the Cu core ball do not melt at a melting temperature of the solder, the solder bump does not crush at a mounting process even if the solder bump receives the weight of the semiconductor package. Therefore, the semiconductor package can be supported very well. Such technology associated to the Cu ball and the like is disclosed, for example, in International Patent Publication No. WO/1995/24113 (hereinafter referred to as "WO/1995/24113 publication").

By the way, the downsizing of the electronic components allows the high-density mounting, but the high-density mounting causes soft error problems. The soft error is a possibility of rewriting a storage content of a memory cell in a semiconductor integrated circuit (IC circuit) with alpha ray entering into the memory cell.

It is conceivable that beta decay occurs on a radioactive element such as U, Th, Po, etc. or a radioactive isotope included in Pb, Bi, etc. in the solder alloy and then alpha decay occurs so that the alpha ray is emitted. Recently, a low alpha ray solder material is developed wherein the contained amount of the radioactive element is reduced. An associated technology is disclosed, for example, in Japanese Patent No. 4,472,752 (hereinafter referred to as "JP/4,472,752 patent").

In the Cu core ball, the solder plating film is formed on the surface of the Cu ball. This solder plating film is a plated layer having a uniform film thickness. However, a growth of a crystal may be non-uniform based on a condition of the plating process and like. As a result, the surface thereof may be uneven. The Cu core ball having the uneven surface does not roll smoothly. Therefore, when the ball is jointed as the solder bump, an accuracy of the joint position becomes low.

In addition, organic constituent maybe caught up in the uneven surface during a period of forming the bump and the organic constituent may be molten and gasified during the reflow. This may remain as void in the solder plating film. The remained void causes trouble such as a reduced reliability of the joint or a position gap of the solder bump at a time when the gas composition is discharged from the solder plating film.

Japanese Patent Application Publication No. 2010-216004 (hereinafter referred to as "JP/2010-216004 publication") or the like discloses a technology of improving the unevenness of the solder plating film.

By the way, the WO/1995/24113 publication discloses the Cu ball and the Cu core ball having the higher sphericity. However, this publication does not disclose the alpha dose of the Cu core ball.

Moreover, the WO/1995/24113 publication describes only Pb—Sn alloy as the solder alloy of making up the solder in the background explanation. The alpha ray is emitted from an isotope $^{210}$Pb of Pb included as an impurity in Sn along the decay process $^{210}$Pb->$^{210}$Bi->$^{210}$Po->$^{206}$Pb. Alpha ray are generated by the disintegration of polonium Isotope $^{210}$Po to Isotope $^{206}$Pb.

It is conceivable that the Pb—Sn solder alloy contains its radioisotope $^{210}$Pb because the Pb—Sn solder alloy contains Pb in large quantities wherein this solder alloy is only one disclosed in the WO/1995/24113 publication. Therefore, even if this solder alloy is applied as the solder film of the Cu core ball, it is impossible to reduce the alpha dose. The WO/1995/24113 publication does not disclose a Sn plating on the Cu ball and an electrolytic plating under a flowage condition of the Cu ball and electrolysis solution.

In electrolytic refining described in the WO/1995/24113 publication, since an electrolytic deposition surface is limited to one direction, it is impossible to form a plating film having an even film thickness on a micro work piece such as the Cu ball.

The JP/4,472,752 patent discloses a technology of Sn ingot having a low alpha dose wherein it does not only electrolytically refine but also reduces the alpha dose by suspending adsorbent in electrolyte solution to adsorb Pb and Bi.

According to the JP/4,472,752 patent, since a standard electrode potential of Pb or Bi is close to that of Sn, it is difficult to reduce the alpha dose only by depositing electrolytically Sn on a plane electrode with a general electrolytic refining. Assuming that the electrolytic refining described in the JP/4,472,752 patent is applied to a process of forming the plating film on the Cu ball and the adsorbent is suspended in the plating solution for the barrel plating, the adsorbent is stirred simultaneously with the stir of the plating solution and the work piece. In this case, there is a possibility that the Pb ion and Bi ion absorbed on the adsorbent become carriers and are incorporated into the solder film with the adsorbent.

The solder plating film, which takes in the adsorbent, emits the high alpha ray. Since the adsorbent has a very small grain diameter of the order of sub-micron, it is difficultly conceivable to separate and collect the adsorbent after the suspension while flowing the plating solution. Therefore, it is difficult to prevent the adsorbent, to which Pb and Bi are absorbed, from being incorporated into the film.

In addition, the WO/1995/24113 publication discloses a Pb—Sn based solder alloy. However, since a plating method, a deposit method, a brazing method and the like are described as an equivalent method, this publication does not disclose a reduction of the alpha dose for a Sn based solder.

The subject matter of the WO/1995/24113 publication is to manufacture the Cu core ball having the high sphericity. The JP/4,472,752 patent discloses that the alpha dose is reduced by removing Pb from Sn-base wherever possible in the electrolytic refining process.

Therefore, a person skilled in the art, who knows the WO/1995/24113 publication, cannot suppose a problem where it is required to reduce the alpha dose from the Cu core ball disclosed in this publication. In addition, the composition of the Pb—Sn solder is different from that of the Sn based solder. Thus, it is conceivable that huge numbers of trial-and-error processes are required to suppose the problem of reducing the alpha dose of the Sn based solder and to select the Sn based solder from an endless number of solder alloys instead of the Pb—Sn solder alloy for the solder film.

It may be very difficult for those skilled in the art to make the plating solution by using the Sn ingot having the lower alpha dose described in the WO/1995/24113 publication and to form the Cu core ball with the plating method described in this publication.

If a joint is formed by using the Cu core ball manufactured with the prior arts described in the WO/1995/24113 publication or the JP/4,472,752 patent, there is a high possibility that radioactive elements in the solder film of the Cu core ball diffuse into the electrodes of the joint and then the alpha ray is emitted. Therefore, the soft error as a new problem of the high-density mounting cannot be solved.

The JP/2010-216004 publication discloses the improvement of the surface roughness of the solder plating film by using a smoothing process wherein media such as abrading agent contact with the surface of the solder plating film. The disclosed media are a physics method of mechanically removing as described hereinbefore and a chemical method such as acid wash.

However, it takes very long hours for the smoothing process with such media to accomplish the surface roughness (Ra) enough for the mounting process. For example, 5 through 6 hours are required for accomplishing the arithmetic average roughness Ra of the above surface roughness equal to or less than 0.3 μm. However, a practical realization of such surface roughness is difficult.

SUMMARY OF THE INVENTION

Therefore, the present invention provides a Cu core ball, a solder paste and a solder joint that inhibit a generation of a soft error, improve a surface roughness not affecting a mounting process and make their alpha dose low.

In order to solve the above-described problems, the present invention provides the Cu core ball comprising a Cu ball and a solder plating film of coating the surface of the Cu ball. The Cu ball and the solder plating film are constructed as follows.

A pure degree of the Cu ball as a center material is 99.9% through 99.995%, its sphericity is equal to or higher than 0.95 and its alpha dose is equal to or less than 0.0200 cph/cm$^2$. The Cu ball is an inside ball wherein impurity components are included in the Cu ball. In the impurity components, the contained amount of Pb and/or Bi including their radioisotopes is equal to or larger than 1 ppm. Similarly, the contained amount of U and Th as radioactive elements in the inside ball is equal to or less than 5 ppb and preferably equal to or less than 2 ppb.

The solder plating film comprises Sn or a solder alloy whose basis material is Sn. In a case of the solder alloy, the contained amount of Sn is equal to or larger than 40%. The arithmetic average roughness Ra of the surface roughness for the solder plating film is equal to or less than 0.3 μm and preferably about 0.2 μm. In another embodiment, the pure degree of the Cu ball as the inside ball is 99.9 through 99.995% and its sphericity is equal to or higher than 0.95.

The solder plating film comprises the Sn or the solder alloy whose basis material is Sn. In this case, the contained amount of the U and Th as the radioactive elements is equal to or less than 5 ppb and preferably equal to or less than 2 ppb. The alpha dose of the Cu core ball is made to be equal to or less than 0.0200 cph/cm$^2$. The arithmetic average roughness Ra of the surface roughness for the solder plating film is equal to or less than 0.3 μm and preferably about 0.2 μm.

The Cu core ball can be used as the solder joint as well as a solder powder for a solder paste.

For accomplishing the above-described conditions, the inventors first selected the Cu ball used for the Cu core ball. As a result, they found that if the Cu ball did not contain a predetermined amount of Pb and/or Bi, then the sphericity of the Cu ball reduces, the solder plating for the Cu ball was not even during the plating with the solder and thereby the sphericity of the accomplished Cu ball reduced.

When spheronizing the Cu ball, a heating process temperature is high such as equal to or higher than 1,000° C. so that the lower alpha dose of the Cu ball is implemented by volatilizing the radioactive elements in the impurities contained in the Cu ball.

In order to reducing the alpha dose of the solder film that composes the Cu core ball, the inventors studied hard this subject by focusing on the plated film with the plating method. The inventors found unexpectedly that the elements of Pb, Bi, Po formed salt without suspending the adsorbent when forming the plated film on the Cu ball by the flowage of the Cu balls and the plating solution so as to reduce Pb, Bi and Po in the plating solution. Po was formed when the radioisotopes of Pb and Bi decay. Since the salt was electrically neutral, the radioactive element was not incorporated into the plated film. Then, they found that the alpha dose of the plating film reduced wherein the Cu core ball comprised the plating film.

The smoothing process for the surface roughness is performed by irradiation of ultrasonic waves under a condition of dipping the Cu core ball in the plating solution. Because of this irradiation of the ultrasonic waves, the target surface roughness can be accomplished in a short time.

DESCRIPTION OF THE PREFERRED EMBODIMENTS

The present invention will be described in detail. In this specification, units (ppm, ppb and %) of a composition of solder plating film of a Cu core ball represent rates (mass ppm, mass ppb and mass %) to amass of the solder film if not being specified. Units (ppm, ppb and %) of a composition of the Cu ball represent rates (mass ppm, mass ppb and mass %) to a mass of the Cu ball if not being specified.

The Cu core ball according to the present invention comprises the Cu ball and the solder plating film for coating a surface of the Cu ball. The Cu ball and the plated film (solder plating film) as components of the Cu core ball will be described in detail.

1. As for Cu Ball:

The Cu ball is not melted at a soldering temperature when being used as a solder bump. Since a sphericity of the Cu ball is high, a dispersion of a solder joint height can be suppressed. Therefore, it is preferable that a dispersion of a diameter thereof is small.

(1a) Pure Degree of Cu Ball: Equal to or Larger Than 99.9% and Equal to or Less Than 99.995%

It is preferable that a pure degree of the Cu ball is equal to or larger than 99.9% and equal to or less than 99.995%. By applying an impurity proper, the sphericity of the Cu ball is improved and an enough volume of crystal cores can be kept in Cu solution.

When manufacturing the Cu ball, the Cu material is formed into a predetermined shaped chip and is melted by being heated at a temperature of 1,000° C. or above. Then, the melted Cu becomes a spherical form with its surface tension. By solidifying it, it becomes the Cu ball. At a process of solidifying the molten Cu from its liquid state, the crystal grains grow up in the molten Cu of the spherical form. Its detailed description will be discussed hereinafter. In this process, if there are a lot of impurity elements, they become the crystal cores and prevent the crystal grains from growing. The molten Cu of the spherical form becomes the Cu ball having the high sphericity with the fine crystal grains that are suppressed to grow up.

On the other hand, if the number of impurity elements is less, then relatively less elements become the crystal core and they grow up in a directional property without suppressing the grain growth. As a result, a part of the surface of the spherical form molten Cu projects and solidifies so that the sphericity is low. Therefore, it is necessary to contain the impurity to some degree for increasing the sphericity of the Cu ball.

It is conceivable that the impurity may be Sn, Sb, Bi, Zn, As, Ag, Cd, Ni, Pb, Au, P, S, U, Th, etc. as will become apparent below.

It is desirable that the pure degree of the Cu ball is within a range between 99.9% (including 99.9%) and 99.995% (including 99.995%) from the viewpoints of the sphericity problem, the alpha dose suppression that will be described hereinafter, and the degradation suppression of the electrical conductivity and thermal conductivity of the Cu ball based on the reduced pure degree.

In the solder plating film that will be described hereinafter, the higher its pure degree is, the lower its alpha dose is reduced. On the other hand, in the Cu ball, its alpha dose can be reduced without increasing its pure degree beyond necessity. A reason thereof will be discussed below.

Since the melting point of Cu is higher than that of Sn, the heating temperature of Cu is higher than that of Sn during the spheronizing. A heating treatment at a high temperature is performed for manufacturing the Cu ball wherein this treatment was not performed in the prior art as will become apparent below. Therefore, radioactive elements such as $^{210}$Po, $^{210}$Pb, $^{210}$Bi, etc. contained in the impurity vaporize during the heating treatment. As a result, even if there is the radioactive element in the impurity, the amount of the alpha dose emitting therefrom is not enough to affect.

As will become apparent below, there are many cases that the plating film of coating the Cu ball contains radioisotope of Pb, Bi, etc.

The solder plating film uses the solder including Sn as its basis material. However, almost all of the radioactive elements contained in the solder solution remain in the plating solution without vaporizing. Because the reduction of the alpha dose cannot be expected in the plating film process, it is required to reduce the concentration of the impurity such as Pb, Bi, etc. and to increase the pure degree of the solder plating film as will become apparent below.

(1b) Alpha Dose: Equal to or Less Than 0.0200 cph/cm$^2$

The alpha dose emitted from the Cu ball is preferably equal to or less than 0.0200 cph/cm$^2$. This number means that the soft error counts for nothing in the high-density mounting of the electronic components.

In the manufacturing of the Cu ball, an insignificant amount of $^{210}$Po remained in the Cu raw material vaporizes by a reheating treatment process in addition to the normal heating treatment process. Thus, the alpha dose of the Cu ball become further lower in comparison with the Cu raw material. The alpha dose is preferably equal to or less than 0.0010 cph/cm$^2$ from a standpoint of suppressing the soft error.

(1c) Total Contained Amount of Pb and/or Bi Equal to or Larger than 1 ppm

The total contained amount of Pb and/or Bi in the impurity elements in the Cu ball is preferably equal to or less than 1 ppm.

$^{210}$Pb and $^{210}$Bi contained in Pb and Bi change to $^{210}$PO through beta decay. It is prefer that the contained amount of Pb and Bi as the impurity elements is as small as possible in order to reduce the alpha dose. However, since the contained amount of these radioactive elements is small originally, it is conceivable that $^{210}$Bp and $^{210}$Bi are removed by the heating treatment in the spheronizing process of the Cu ball.

It is better to increase the contained amount of the impurity elements in order to improve the sphericity of the Cu ball. Therefore, it is prefer that the total contained amount of Pb and/or Bi is equal or larger than 1 ppm in consideration of the hardness and sphericity of the Cu ball. This contained amount may be equal or larger than 1 ppm and the amount may be 10-50 ppm or above it, for example, about 1,000 ppm in order to suppress the degradation of the electrical conductivity of the Cu ball.

(1d) Sphericity of Cu Ball: Equal to or Higher than 0.95

If the sphericity of the Cu ball is less than 0.95, the Cu ball becomes an indefinite shape. Therefore, the possibility is increased wherein the bumps having uneven heights are formed at the bump formation period and poor joints are produced. In addition, the solder plating on the Cu ball may be uneven. When an electrode is mounted on the Cu core ball and it is processed by a reflow treatment, there maybe a position gap for the Cu core ball and a self-alignment property becomes worse. Therefore, it is better that the sphericity is equal to or higher than 0.95, preferably about 0.990.

The sphericity represents a gap from a true sphere. The sphericity can be determined by many kinds of methods, for example, a least-square circle method (LSC method), a minimum zone circle method (MZC method), a maximum inscribed circle method (MIC method), a minimum circumscribed circle method (MCC method), etc.

It is prefer that the above values of the sphericity may be kept regardless of the plating film coated on the Cu ball.

(1e) Diameter of Cu Ball: 1-1000 µm

A diameter of the Cu ball composing the present invention is preferably 1-1000 µm. If the diameter is within this range, the spherical Cu ball can be stably manufactured. Moreover, a shorted connection can be suppressed when a pitch between the terminals is narrow.

If the diameter of the Cu ball is about 1-300 µm, they can be mixed as the powder in the solder paste in a different usage pattern.

In a base process of the Cu ball, the surface of the Cu ball may be previously coated with another metal plating layer before forming the solder plating film (will be described below). If the surface of the Cu ball is coated with a Ni plating layer, a Co plating layer or the like, a Cu elution into the solder plating film can be reduced. Therefore, it is possible to suppress a Copper erosin.

2. As For Solder Plating Film

The Cu core ball of the present invention is configured by coating the solder plating film with a predetermined thickness on the surface of the Cu ball.

The solder plating film is formed by the flowage of the Cu ball as the main work piece and the plating solution. It was found that the elements having the radioisotopes in Pb, Bi, Po, etc. generate salt in the plating solution and are deposited. Once the extracted material of the salt is generated, it exists stably in the plating solution.

Therefore, according to the Cu core ball of the present invention, the extracted material is not incorporated into the solder plating film so that it can reduce the amount of the radioisotopes contained in the solder plating film. As a result, the alpha dose of the Cu core ball can be significantly reduced.

(2a) Composition of Solder Plating Film

The composition of the solder plating film is Sn or an alloy composition of a Sn-based lead-free solder alloy. The alloy composition is preferably Sn-3Ag-0.5Cu alloy from a standpoint of a drop impact characteristic.

Other alloy composition may be Sn—Ag alloy, Sn—Cu alloy, Sn—Ag—Cu alloy, Sn—In alloy or such compositions to which a predetermined alloy element is added. An amount of Cu in each of these compositions is equal to or larger than 40 mass percent. The added alloy element may be, for example, Ag, Cu, In, Ni, Co, Sb, Ge, P, Fe, etc.

A thickness of the solder plating film is not specially limited, however, it is preferably equal to or less than 100 µm. Generally, the thickness is 20-50 µm.

(2b) Contained Amount of U: Equal to or Less Than 5 ppb, and Th: Equal to or Less Than 5 ppb U and Th are radioactive elements. It is required to reduce the contained amount of these elements in order to suppress the soft error. The contained amount of each U and Th should be equal to or less than 5 ppb in order to make the alpha dose of the solder plating film equal to or less than 0.0200 cph/cm$^2$. In addition, from a viewpoint of the suppression of the soft error for the current or future high-density mounting, the contained amount of each U and Th should be equal to or less than 2 ppb. In a case of the measurement method (ICP-MS) used at this time, the value 2 ppb as the contained amount of U and Th is a measurement limit.

(2c) Alpha Dose: Equal to or Less Than 0.0200 cph/cm$^2$

According to the present invention, the alpha dose emitting from the surface of the Cu core ball is equal to or less than 0.0200 cph/cm$^2$. This amount of the alpha dose does not affect the soft error in the high-density mounting of the electronic components.

Since the solder plating film is formed under a temperature of about 100° C., it is difficult to consider the contained amount of U, Th, Po, Bi, Pb, etc. reduce based on the vaporization of their radioisotopes.

When the plating process is performed during the flowage of the plating solution and the Cu ball, the radioisotope of U, Th, Pb, Bi, $^{210}$Po, etc. generate the salt in the plating solution and are deposited. The deposited salt is electrically neutral and are not mixed with the solder plating film even if the plating solution flows. Since the salt keeps the deposition, the contained amount of the radioactive elements in the solder plating film is significantly reduced.

According to the present invention, the contained amount of the radioactive elements in the solder plating film can be significantly reduced so that the alpha dose of the Cu core ball can be suppressed to a value equal to or less than 0.0200 cph/cm$^2$ or preferably equal to or less than 0.0100 cph/cm$^2$.

In a case of using a Sn solder as the solder plating film composition, the pure degree of the solder plating film is the total contained amount of the impurities except Sn in the solder plating film. When the alloy composition of the solder plating film is the solder alloy of Sn-3Ag-0.5Cu, the pure degree of the solder plating film is the sum contained amount of the impurities except Sn, Ag and Cu in the solder plating film.

The impurities contained in the Sn solder plating film may be Ag, Ni, Pb, Au, U, Th, etc. In a case of the solder plating film comprising Sn—Ag—Cu alloy, the impurity may be Sb, Fe, As, In, Ni, Pb, Au, U, Th, etc.

In these impurities, it is prefer that the contained amount of Bi is small. Generally, the raw material of Bi includes $^{210}$Bi of the radioisotope slightly. Therefore, it is conceivable that the alpha dose of the solder plating film can be significantly reduced by reducing the contained amount of Bi. The contained amount of Bi is preferably equal to or less than 15 ppm, more preferably equal to or less than 10 ppm and most preferably 0 ppm.

3. Manufacturing Example of Cu Core Ball

Next, the manufacturing example of the above Cu core ball will be described.

(3a) As For Cu Ball (i) A Cu material as the raw material is put on a heat-resistant plate such as a ceramic plate and both the material and the heat-resistant plate are heated by an oven. There are a lot of circle grooves whose bottoms are hemispherical.

The diameter and depth of the groove are appropriately set in accordance with the grain diameter of the Cu ball. For example, the diameter is 0.8 mm and the depth is 0.88 mm. The chip-shaped Cu material (hereinafter, referred to as "chip material") is produced by cutting a Cu fine line and each groove of the heat-resistant plate receives one chip material.

(ii) The heat-resistant plate whose groove receives the chip material is heated up to 100-1,300° C. in the oven filled with ammonia decomposition gas and its heating treatment is performed for 30-60 minutes. When the temperature in the oven becomes equal to or higher than the melting point of Cu, the chip material is melted and becomes a spherical shape. After that, the oven is cooled and the Cu ball is formed in the groove of the heat-resistive plate.

(iii) After cooling, the formed Cu ball is again under the heating treatment whose temperature is 800-1,000° C. that is lower than the melting point of Cu. A purpose of the reheating treatment is to reduce the alpha dose by volatizing the remained radioactive elements.

One of the other methods of the spheronizing is an atomizing method wherein the molten Cu is dropped through an orifice provided at a bottom of a crucible and the formed droplet is cooled to pelletize the Cu ball. Another method is to heat the Cu cut metal to a temperature equal to or higher than 1,000° C. by thermal plasma for the spheronization.

The spheronized Cu ball may be under the reheating treatment at a temperature of 800-1,000° C. for 30-60 minutes. The Cu material for the Cu ball may be under the heating treatment at a temperature of 800-1,000° C. before spheronizing the Cu ball.

A palette, a wire, a pillar, etc. can be used for the Cu material that is the raw material of the Cu ball. The pure degree of the Cu material may be 99.9-99.99% to prevent the Cu ball pure degree from decreasing too much. In a case of the Cu material having the high pure degree, the holding temperature of the molten Cu may be reduced to about 1,000° C. as is conventionally done.

The above explained heating treatment may be appropriately omitted or modified in accordance with the pure degree and the alpha dose of the Cu material. Moreover, in a case of manufacturing the Cu ball having the high alpha dose or the Cu ball having a different shape, the Cu ball can be reused as the raw material and the alpha dose can be reduced.

(3b) Solder Plating Film Treatment

The plating film is formed by dipping the Cu ball formed as described above in the plating solution and flowing the plating solution. There are some methods for forming the solder plating film. One of them is an electrolytic plating method, such as a well-known barrel plating, etc. Another method is that a pump connected to a plating bath generates a high-speed turbulent flow of the plating solution in the plating bath and forms the plating film on the Cu ball with the turbulent flow of the plating solution. Additional method is that a vibration plate is provided in the plating bath, the vibration plate is vibrated at a predetermined frequency to stir the plating solution with the high-speed turbulent flow and forms the plating film on the Cu ball with the turbulent flow of the plating solution.

The following is an example of forming the Cu core ball having about 140 μm diameter by forming the Sn—Ag—Cu solder plating film having 20 μm film thickness on the Cu ball having 100 μm diameter.

(3b-i) The Sn—Ag—Cu contained plating solution includes essential components that are water based medium, sulfonic acid and metal components such as Sn, Ag and Cu.

The metal components in the plating solution exist as Sn ion ($Sn^{2+}$ and/or $Sn^{4+}$), Ag ion ($Ag^+$) and Cu ion ($Cu^+/Cu^{2+}$). The plating solution is made by mixing plating mother liquid mainly comprising water and sulfonic acids with metallic compound. The plating solution contains preferably organic complexing agent in order to stabilize the metallic ions.

The following is examples of the metallic compound in the plating solution.

Examples of Sn compound may be stannous compound such as tin salt of organic sulfonic acid, e.g., methane sulfonic acid, ethane sulfonic acid, 2-propano-sulfonic acid, and p-phenol sulfonic acid; tin sulfate; tin oxide; tin nitric acid; tin chloride; tin bromide; tin iodide; tin phosphate; tin pyrophosphoric acid; tin acetate; tin formate; tin citrate; tin gluconate; tin tartrate; tin lactate; tin succinate; tin sulfamate; tin borofluoride; tin silicofluoride, etc. One of these Sn compounds may be used or a mixture of a plurality thereof may be used.

Examples of Cu compound may be copper salt of the above described organic sulfonic acid, copper sulfate, copper oxide, copper nitric acid, copper chloride, copper bromide, copper iodide, copper phosphate, copper pyrophosphoric acid, copper acetate, copper formate, copper citrate, copper gluconate, copper tartrate, copper lactate, copper succinate, copper sulfamate, copper borofluoride, copper silicofluoride, etc. One of these Cu compounds may be used or a mixture of a plurality thereof may be used.

Examples of Ag compound may be silver salt of the above described organic sulfonic acid, silver sulfate, silver oxide, silver nitric acid, silver chloride, silver bromide, silver iodide, silver phosphate, silver pyrophosphoric acid, silver acetate, silver formate, silver citrate, silver gluconate, silver tartrate, silver lactate, silver succinate, silver sulfamate, silver borofluoride, silver silicofluoride, etc. One of these Ag compounds may be used or a mixture of a plurality thereof may be used.

The contained amount of each metal in the plating solution is 0.21-2 mol/L, preferably 0.25-1.00 mol/L for $Sn^{2+}$; 0.01-0.1 mol/L, preferably 0.02-0.05 mol/L for $Ag^+$; and 0.002-0.02, preferably 0.003-0.01 mol/L for $Cu^{2+}$. Since only $Sn^{2+}$ effects the plating, it is required to adjust the amount of $Sn^{2+}$.

A ratio of the Ag ion concentration to the Cu ion concentration (Ag/Cu molar ratio) is preferably within a range of 4.50-5.58. In this range, the Sn—Ag—Cu plating film can be formed wherein it comprises the Sn-3Ag-0.5Cu alloy having the low melting point.

(3b-ii) According to the following expression (1) based on Faraday's law of electrolysis; a precipitation amount of the predetermined solder plating is estimated. Then, an electric quantity is calculated, and a current is applied to the plating solution so as to produce the calculated electric quantity. The plating treatment is performed by the flowage of the Cu ball and the plating solution.

In a case of coating the Sn—Ag—Cu solder plating film having 20-μm film thickness on the Cu ball having 100-μm diameter, the electric quantity of about 0.0108 coulomb is required. A size of the plating bath is determined in accordance with the total volume of the Cu ball and the plating solution.

$$w(g)=(I \times t \times M)/(Z \times F) \qquad \text{Expression (1)}$$

In the expression (1), w represents an electrolysis precipitation amount (g), I represents a current (A), t represents a current applying time (second), M represents an atomic weight of an element to be precipitated (118.71 for Sn), Z represents an atomic valence (bivalent for Sn) and F represents Faraday's constant (96,500 coulomb). The electric quantity Q (A×second) is (I×t).

According to the present invention, the plating process is performed while flowing the Cu ball and the plating solution. However, the flowing method is not limited. For example, the barrel electrolysis plating method may be used wherein a barrel rotates to flow the Cu ball and the plating solution.

(3b-iii) Atmospheric Air and $N_2$ After the Plating Treatment:

The Cu core ball of the present invention is obtained after drying it in an atmosphere during a predetermined time. This solder plating film process can be applied to a form of column, pillar and pellet having a core of Cu.

In order to measure the sphericity and the alpha dose of the Cu core ball according to the present invention, the following Cu core ball (sample) was prepared. This will be described below.

4. Example of Preparing Sample Cu Ball (4a) Cu Ball

Figure 4:
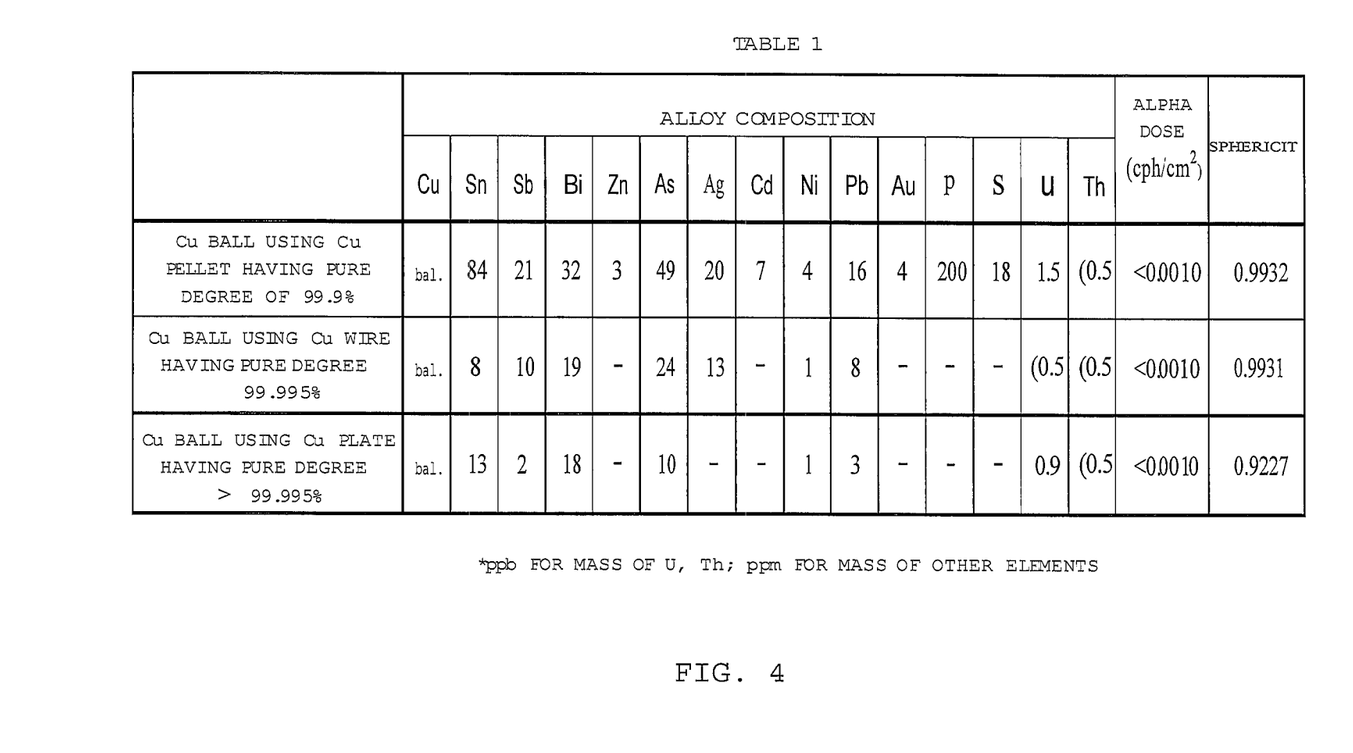
FIG. 4 shows Table 1 that represents an element analysis result and a sphericity of a formed Cu ball.

The condition for manufacturing the Cu ball having the high sphericity was researched. The Cu pellet having the pure degree of 99.9%, the Cu wire having the pure degree equal to or less than 99.995% and the Cu plate having the pure degree larger than 99.995% were prepared. After each of them was put in the crucibles, their temperature was elevated to 1,200° C. and the heating process was performed for 45 minutes. The molten Cu was dropped through the orifice provided at the bottom of the crucible. The formed droplet was cooled to pelletize spheronize the Cu ball. The formed Cu ball has an average grain diameter of 250 μm. Table 1 shown in FIG. 4 represents the element analysis result and the sphericity of the formed Cu ball. A method for measuring the sphericity will be discussed hereinafter.

(4b) Sphericity of Cu Ball

The sphericity was measured by using a CNC image measurement system. This system was an ultra-quick vision model ULTRA QV 350-PRO manufactured by Mitsutoyo Corporation. The sphericity is an arithmetic mean value calculated by dividing a diameter of each of 500 Cu balls by a length of the longest axis of each Cu ball. The closer to the upper limit 1.00, the closer to the true sphere.

In this invention, the length of the diameter and the length of the longest axis are values measured by the ultra-quick vision model ULTRA QV 350-PRO manufactured by Mitsutoyo Corporation.

Figure 1:
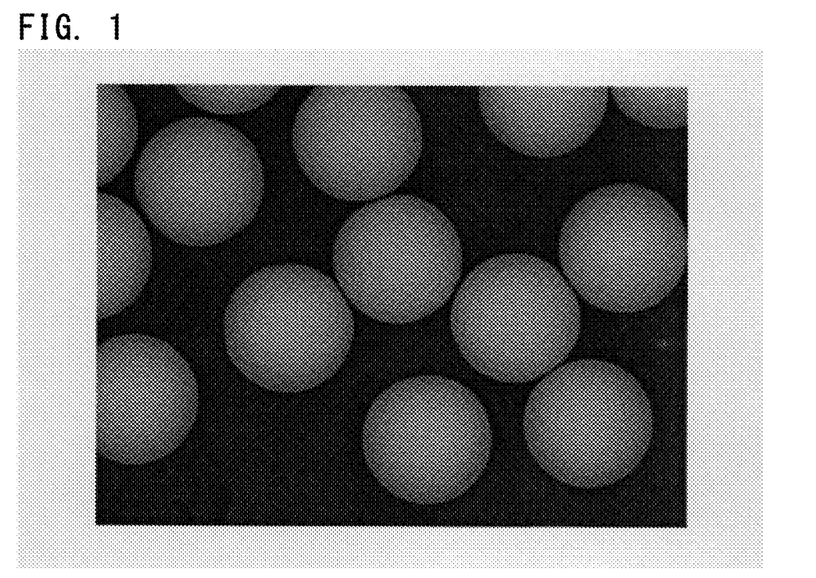
FIG. 1 shows a SEM photograph of a Cu ball manufactured by using a Cu pellet having a pure degree of 99.9%.
Figure 2:
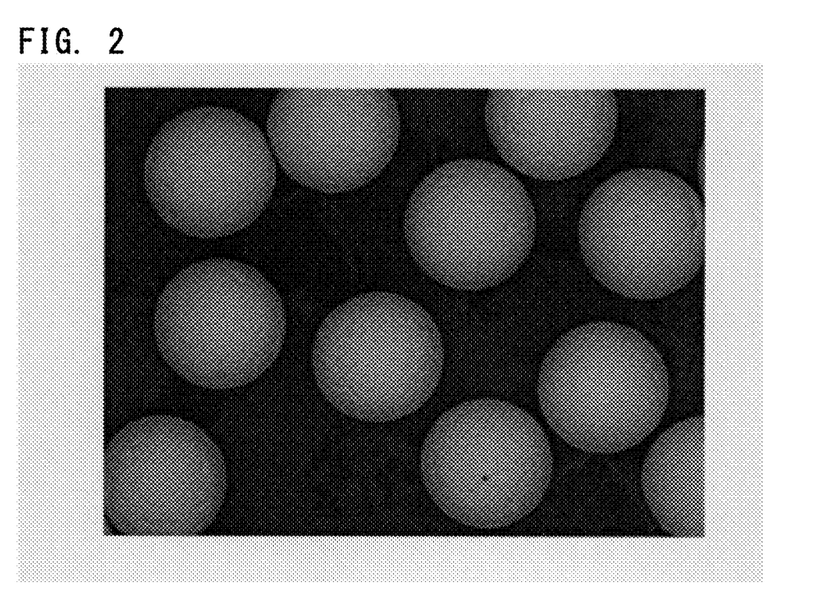
FIG. 2 shows a SEM photograph of a Cu ball manufactured by using a Cu wire having a pure degree equal to or less than 99.995%.
Figure 3:
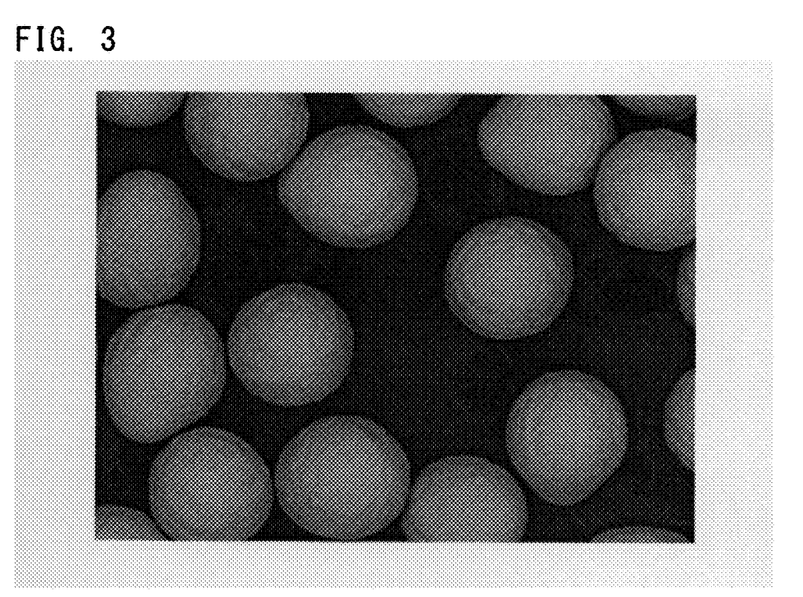
FIG. 3 shows a SEM photograph of a Cu ball manufactured by using a Cu plate having a pure degree larger than 99.995%.

FIGS. 1-3 shows SEM photographs of each formed Cu ball. FIG. 1 is the SEM photograph of the Cu ball manufactured by using a Cu pellet having a pure degree of 99.9%. FIG. 2 is the SEM photograph of the Cu ball manufactured by using a Cu wire having a pure degree equal to or less than 99.995%. FIG. 3 is the SEM photograph of the Cu ball manufactured by using a Cu plate having a pure degree higher than 99.995%. A magnification ratio of these SEM photographs is 100 times.

(4c) Alpha Dose of Cu Ball

An alpha-ray measurement instrument of a gas-flow proportional counter was used to measure the alpha dose. A measurement sample is the Cu balls that are bedded on a bottom of a low-depth vessel having a flat bottom of 300 mm×300 mm so as not to see the bottom. This measurement sample was put in the alpha-ray measurement instrument and is remained in an atmosphere of PR-10 gas flow for 24 hours. Then, the alpha dose was measured.

The PR-10 gas (argon 90% and methane 10%) used for the measurement was one that a gas bottle filled with the PR-10 gas was kept for a period equal to or longer than three weeks.

A reason why using the gas bottle kept for the period equal to or longer than three weeks is based on JESD221 of JEDEC STANDARD-Alpha Radiation Measurement in Electronic Materials determined by JEDEC (Joint Electron Device Engineering Council) not so as to produce the alpha-ray by radon in the atmospheric air that enters into the gas bottle.

(4d) Analyzing Element of Cu Ball

The element analysis was executed with an inductively-coupled plasma source mass spectrometry (ICP-MS analysis) for U and Th and an inductively-coupled plasma emission spectroanalysis (ICP-AES analysis) for the other elements.

A table 1 of FIG. 4 shows the element analysis result and alpha dose of the manufactured Cu ball.

As shown in FIGS. 1, 2 and 4 (Table 1), the sphericity is equal to or higher than 0.990 for the Cu balls using the Cu pellet having the pure degree of 99.9% and the Cu wire having the pure degree equal to or less than 99.995%. On the other hand, as shown in FIGS. 3 and 4 (Table 1), the sphericity is less than 0.95 for the Ca ball using the Cu plate having the pure degree higher than 99.995%.

Therefore, the sample of the following examples is the Cu core ball formed by using the Cu ball manufactured with the Cu pellet having the pure degree of 99.9%.

[Sample 1]

A producing example of the Cu core ball according to the sample 1 will be described below.

As for the Cu ball produced with the Cu pellet having the pure degree of 99.9%, the Sn solder plating film was formed to produce the Cu core ball under the following condition.

The Cu core ball was produced by the plating treatment using the following plating solution with the electric quantity of about 0.17 coulomb so as to coat the Cu ball having 250-μm diameter with the Sn solder plating film having 50-μm thickness. By observing the cross-section of the Cu core ball with the SEM photograph, it was found that the film thickness of the solder plating film was 50 μm. After processing, it was dried in the atmospheric air to obtain the Cu core ball.

[Solder Plating Solution Used in Sample 1]

All 54-weight-percent solution of methanesulfonic in water was mixed with one third of water necessary for adjusting the plating solution and the mixture was put in a stirring vessel. Acetylcysteine is an example of mercaptan compound as complexing. It was added to the mixture. After confirming the dissolution, 2,2-ditiodianiline was added wherein 2,2-ditiodianiline is one example of aromatic amino compound. When the mixture became light blue gel solution, metanesulfonate stannous was rapidly added thereto.

Then two third of water necessary for the plating solution was added. Finally, 3 g/L of alpha-naphtol polyethoxylate (EO10 mol) was added to complete the adjustment of the plating solution wherein alpha-naphtol polyethoxylate is an example of surface acting agent. Then, the plating solution was prepared wherein a density of the methanesulfonic was 2.64 mol/L and that of tin ion was 0.337 mol/L.

The methanesulfonate stannous used in this example was prepared from a Sn sheet material as a raw material. An element analysis of the Sn sheet material and the solder plating film was performed wherein the Sn sheet material is as the raw material for the solder plating solution and the solder plating film is formed on the surface of the Cu core ball. In the analysis, a high-frequency inductively-coupled Plasma mass analysis (ICP-MS analysis) was used for U and Th and a high-frequency inductively-coupled plasma emission spectrochemical analysis (ICP-AES analysis) was used for the other elements.

The alpha dose of the Sn sheet material was measured similarly to the measurement for the Cu ball except that the sheet material was overlaid on the vessel having the flat bottom of 300 mm×300 mm. The alpha dose of the Cu core ball was measured similarly to the Cu ball measurement. The sphericity of the Cu core ball was measured under the same condition of the Cu ball measurement. These measurement results are shown in Table 2 of FIG. 5.

[Sample 2]

A producing example of the Cu core ball according to the sample 2 will be described below.

As for the Cu ball produced with the Cu pellet having the pure degree of 99.9%, the Sn—Ag—Cu solder plating film having 50-μm thickness was formed to produce the Cu core ball.

[Solder Plating Solution used in Sample 2]

The solder plating solution was the Sn—Ag—Cu plating solution.

All 54-weight-percent solution of methanesulfonic in water was mixed with one third of water necessary for adjusting the plating solution and the mixture was put in a stirring vessel.

A predetermined amount of silver oxide was put into the vessel while stirring. After confirming the mixture become completely transparent without black deposition, cooper hydroxide was rapidly added. After it was completely dissolved, acetylcysteine was added wherein acetylcysteine is the example of mercaptan compound as complexing. After confirming the dissolution, 2,2-ditiodianiline was added wherein 2,2-ditiodianiline is one example of aromatic amino compound.

When the mixture became light blue gel solution, methanesulfonate stannous was rapidly added thereto. The solution became yellow transparent. Then two third of water necessary for the plating solution was added. Finally, 3 g/L of alpha-naphtol polyethoxylate (EO10 mol) was added to complete the adjustment of the plating solution wherein alpha-naphthol polyethoxylate is an example of surface acting agent. Then, the plating solution was prepared wherein a density of the methanesulfonic was 2.64 mol/L, that of tin ion is 0.337 mol/L, that of cooper ion was 0.005 mol/L and that of silver ion was 0.0237 mol/L.

After preparing the plating solution as described hereinbefore, the plating solution similar to the sample 1 was prepared and then the Cu core ball was formed except using the Sn sheet material used in the sample 1, a Cu plate material and an Ag chip material. The Sn sheet material has the alpha dose of 0.203 cph/cm$^2$. The Cu plate material has the alpha dose<0.0010 cph/cm$^2$ and the pure degree of 6N. The Ag chip material has the alpha dose<0.0010 cph/cm$^2$ and the pure degree of 5N. Then, the element analysis and the measurement of the alpha dose and the sphericity were performed. The measurement result is shown in Table 2 of FIG. 5.

In this example, the tin ion is based on the Sn sheet material, and the silver ion and the copper ion are respectively based on the Ag chip material and the Cu plate material.

[Comparison Sample]

As for the Cu ball manufactured with the Cu pellet having the pure degree of 99.9%, the Sn solder plating film was formed with a welding method under the following condition to make the Cu core ball.

In particular, a plurality of mortar shaped grooves were provided at predetermined positions of an aluminum plate for which a soldering is difficult. The Sn ball having 300-μm diameter was previously formed with the well-known atomizing method by using the above-described Cn sheet.

One Cu ball and one Sn ball were respectively input in each groove provided at the aluminum substrate and flux was jetted thereto. After that, the aluminum plate in a heating furnace was heated to 270° C. to melt the Sn ball. The molten Sn flowed around the Cu ball and coated the Cu ball with the surface tension.

The Cu core ball for the comparison sample was prepared as explained before. The film thickness of the solder plating film was 50 μm. Similarly to the sample 1, the element analysis and the measurement of the alpha dose and the sphericity were executed. The measurement result is shown in Table 2 of FIG. 5.

Figure 5:
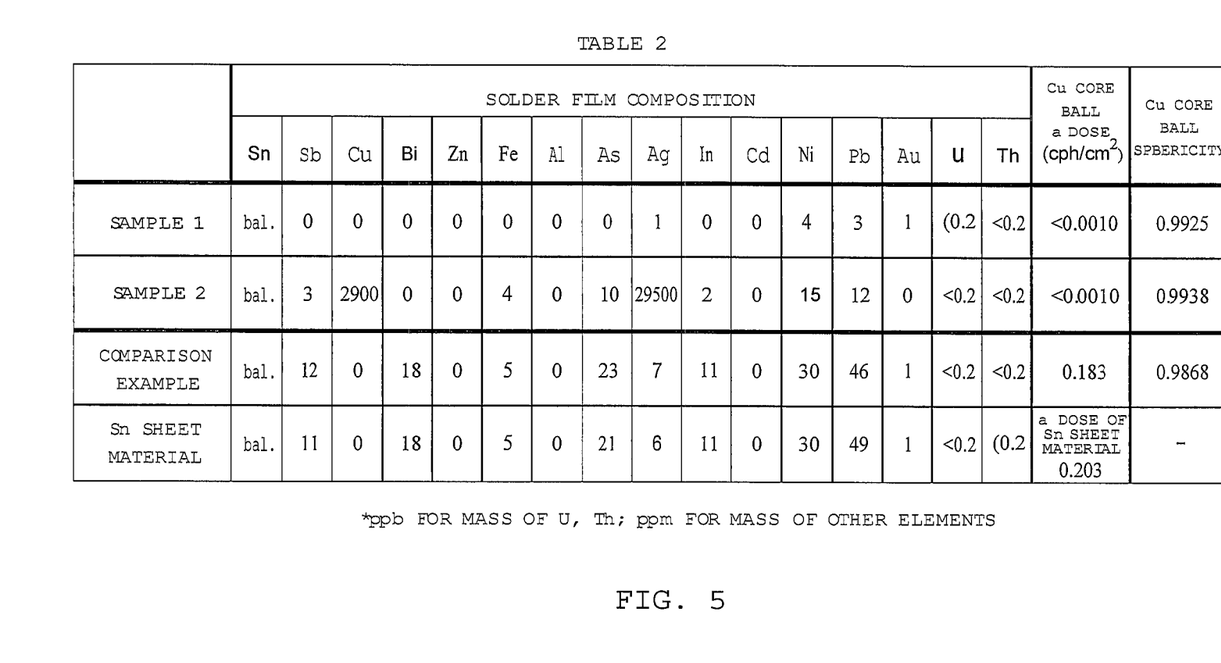
FIG. 5 shows Table 2 that represents measurement result of alpha dose and sphericity of some samples for a Cu core ball.

According to Table 2, the alpha dose of the sample 1 is less than 0.010 cph/cm$^2$. It was proved that the Cu core ball of the sample 1 reduces the alpha dose by forming the solder plating film with a wet plating method.

As for the sample 2, if the composition of the solder plating film is Sn-2.95Ag-0.29Cu, the alpha dose of the solder was less than 0.0010 cph/cm$^2$. It was proved that the Cu core ball of the sample 2 reduces the alpha dose by forming the solder plating film with the plating method similar to the sample 1. After the Cu core balls prepared by the samples 1 and 2 passed one year, the alpha dose increment was not seen.

On the other hand, the comparison sample shows 0.183 cph/cm$^2$ as the alpha dose that is the same range of the Sn sheet material. In the Cu core ball of the comparison sample, the alpha dose could not be reduced to prevent the soft error.

Evaluation on Surface Roughness of Cu Core Ball

The Cu core ball of the samples 1 and 2 can be used as a sample for the surface roughness measurement; however, a new sample was prepared for the surface roughness measurement.

(5a) Sample For Surface Roughness Measurement

The Cu ball similar one used in the sample 1 (using Cu material; diameter 200 μm; pure degree in a range between 99.9% (including 99.9%) and 99.995% (including 99.995%)) is used. The plating treatment for preparation is performed to this Cu ball . In the example, the 2-μm Ni plating treatment was performed.

After that, the plating treatment with 100% Sn was performed to the Cu ball until the film thickness became 48 μm. Therefore, the diameter of the Cu core ball is 250 μm.

This Cu core ball and the plating solution were put in a 300-cc beaker and an ultrasonic equipment irradiates an ultrasonic wave to them. The ultrasonic equipment is a commercially available an ultrasonic washer (As-One Corporation model US-CLEANER). In this example, an output power was 80 W and its frequency was 40 kHz. After predetermined hours passed, it was washed with ion-exchange water. Then, it was dried with a hot wind to make the sample for the surface roughness measurement.

The surface roughness was evaluated (image evaluation) by using a laser microscope of KEYENCE Corporation (model VK-9510 corresponding to JISB0601-1994). It is prefer that an evaluation area is as small as possible. In this example, the diameter of the Cu core ball was 250 μm. Thus, the measurement was performed in 25×25 μm area whose center is the flattest part of the apex of the Cu core ball. A measurement pitch along a z-axis is 0.1 μm.

(5b) Evaluation of Surface Roughness

Under such condition, the surface roughness was measured at any ten points where Ra represents an arithmetic average roughness of the Cu core ball. The measured values are arithmetically averaged to get a true arithmetic average roughness. Simultaneously, the irradiation time of the ultrasonic wave (processing time) was changed for the measurement. Table 3 (FIG. 6) shows the measurement result.

Figure 6:
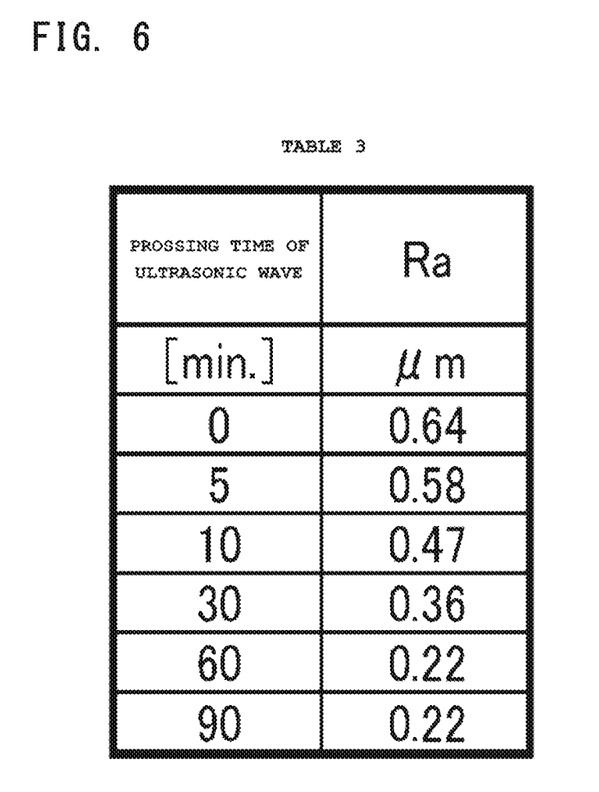
FIG. 6 shows Table 3 that represents a relation between an arithmetic average roughness of the Cu core ball and a processing time of an ultrasonic wave.

As is clear from the result of Table 3, it was confirmed that the arithmetic average roughness Ra became equal to or less than 0.3 µm by irradiating the ultrasonic wave for about 50-60 minutes, and it was improved to about 0.22 µm by 60 minute irradiation. For comparison, JP/2010-216004 publication needs 5-6 hours for processing to get the similar arithmetic average roughness Ra. If the frequency and output level of the ultrasonic wave are appropriately adjusted, better results would be obtained.

As described hereinbefore, the present invention can provide the Cu core ball that suppresses the soft error generation, has the surface roughness not affect the mounting treatment and makes the alpha dose low.

The Cu core ball of the present invention can be applied to the solder joint and the solder paste.

Although various embodiments, which incorporate the techniques of the present invention, have been shown and described in detailed herein, those skilled in the art will readily understand that many other varied embodiments may be incorporated using these techniques, and all are intended to lie within the scope of the following claims.

What is claimed is:

1. A method of manufacturing a Cu core ball, comprising:
    providing a Cu ball as an inside ball, of least 99.9 mass percent but not more than 99.995 mass percent of said Cu ball being Cu, said Cu ball having a contained amount of U equal to or less than 5 ppb by mass, a contained amount of Th equal to or less than 5 ppb by mass, a total contained amount of at least one of Pb and Bi equal to or larger than 1 ppm by mass, and a sphericity equal to or higher than 0.95;
    surrounding the inside ball with a solder plating film of a lead free solder alloy whose primary component is Sn; thereafter, placing the inside ball, surrounded by the solder plating film, into a quantity of a plating solution and irradiating the inside ball, the solder plating film, and the plating solution with an ultrasonic wave for a period time that is sufficient to provide a Cu core ball having an arithmetic roughness equal to or less than 0.3 µm.

2. The method of claim 1 wherein the lead free solder alloy contains no more than 5 ppb by mass of U and no more than 5 ppb by mass of Th.

3. The method of claim 2 including performing the step of irradiating for a time that is great enough to provide an arithmetic roughness equal to or less than 0.22 µm.

4. The method of claim 2 including the step of covering the inside ball with a plating layer comprising at least one element selected from the group consisting of Ni and Co before performing the step of surrounding the inside ball with a solder plating film.

5. The method of claim 2, wherein said Cu core ball has an alpha dose equal to or less than 0.0200 cph/cm$^2$.

6. The method of claim 1 including performing the step of irradiating for a time that is great enough to provide an arithmetic roughness equal to or less than 0.22 µm.

7. The method of claim 6 including the step of covering the inside ball with a plating layer comprising at least one element selected from the group consisting of Ni and Co before performing the step of surrounding the inside ball with a solder plating film.

8. The method of claim 6, wherein said Cu core ball has an alpha dose equal to or less than 0.0200 cph/cm$^2$.

9. The method of claim 1 including the step of covering the inside ball with a plating layer comprising at least one element selected from the group consisting of Ni and Co before performing the step of surrounding the inside ball with a solder plating film.

10. The method of claim 9 wherein said Cu core ball has an alpha dose equal to or less than 0.0200 cph/cm$^2$.

11. The method of claim 1, wherein said Cu core ball has an alpha dose equal to or less than 0.0200 cph/cm$^2$.

* * * * *